US 6,677,643 B2

(12) United States Patent
Iwamoto et al.

(10) Patent No.: US 6,677,643 B2
(45) Date of Patent: Jan. 13, 2004

(54) SUPER-JUNCTION SEMICONDUCTOR DEVICE

(75) Inventors: Susumu Iwamoto, Nagano (JP); Tatsuhiko Fujihira, Nagano (JP); Katsunori Ueno, Nagano (JP); Yasuhiko Onishi, Nagano (JP); Takahiro Sato, Nagano (JP)

(73) Assignee: Fuji Electric Co., Ltd. (JP)

( * ) Notice: Subject to any disclaimer, the term of this patent is extended or adjusted under 35 U.S.C. 154(b) by 223 days.

(21) Appl. No.: 09/811,727

(22) Filed: Mar. 19, 2001

(65) Prior Publication Data

US 2001/0032998 A1 Oct. 25, 2001

(30) Foreign Application Priority Data

Mar. 17, 2000 (JP) ......................... 2000-076691

(51) Int. Cl.[7] .................. H01L 29/76; H01L 29/94; H01L 31/062
(52) U.S. Cl. ..................... 257/341; 257/330
(58) Field of Search ............... 257/330, 262, 257/341

(56) References Cited

U.S. PATENT DOCUMENTS

| 4,286,279 A | * | 8/1981 | Hutson ...................... 257/120 |
| 4,320,410 A | * | 3/1982 | Nishizawa et al. ......... 257/264 |
| 4,754,310 A | | 6/1988 | Coe ........................... 357/13 |
| 5,216,275 A | | 6/1993 | Chen .......................... 257/493 |
| 5,438,215 A | | 8/1995 | Tihanyi ....................... 257/401 |
| 6,081,009 A | * | 6/2000 | Neilson ....................... 257/341 |

FOREIGN PATENT DOCUMENTS

JP        2000-40822        2/2000

* cited by examiner

Primary Examiner—Amir Zarabian
Assistant Examiner—Kiesha Rose
(74) Attorney, Agent, or Firm—Rossi & Associates

(57) ABSTRACT

A super-junction semiconductor is provided that facilitates easy mass-production thereof, reducing the tradeoff relation between the on-resistance and the breakdown voltage, obtaining a high breakdown voltage and reducing the on-resistance to increase the current capacity thereof. The super-junction semiconductor device includes a semiconductor chip having a first major surface and a second major surface facing in opposite to the first major surface; a layer with low electrical resistance on the side of the second major surface; a first alternating conductivity type layer on low resistance layer, and a second alternating conductivity type layer on the first alternating conductivity type layer. The first alternating conductivity type layer including regions of a first conductivity type and regions of a second conductivity type arranged alternately with each other. The second alternating conductivity type layer including regions of the first conductivity type and regions of the second conductivity type arranged alternately with each other. The spacing between the pn-junctions in the second alternating conductivity type layer is wider than the spacing between the pn-junctions in the first alternating conductivity type layer.

9 Claims, 12 Drawing Sheets

US 6,677,643 B2

SUPER-JUNCTION SEMICONDUCTOR DEVICE

FIELD OF THE INVENTION

The present invention relates to semiconductor devices which include, between the major surfaces thereof, a layer with low electrical resistance and an alternating conductivity type layer formed of regions of a first conductivity type and regions of a second conductivity type alternately arranged with each other. Specifically, the present invention relates to vertical semiconductor devices, which facilitate the realization of a high breakdown voltage and a high current capacity, such as MOSFET's (insulated gate field effect transistors), IGBT's (conductivity-modulation-type MOSFET's), bipolar transistors and diodes. The present invention relates also to the method of manufacturing the semiconductor devices described above.

BACKGROUND

The semiconductor devices may be roughly classified into lateral semiconductor devices arranged with electrodes on a major surface, and vertical semiconductor devices which distribute electrodes on both major surfaces facing opposite to each other. When the vertical semiconductor device is ON, a drift current flows in the thickness direction of the semiconductor chip (vertical direction). When the vertical semiconductor device is OFF, the depletion layers caused by applying a reverse bias voltage also expands in the vertical direction.

Figure 7:
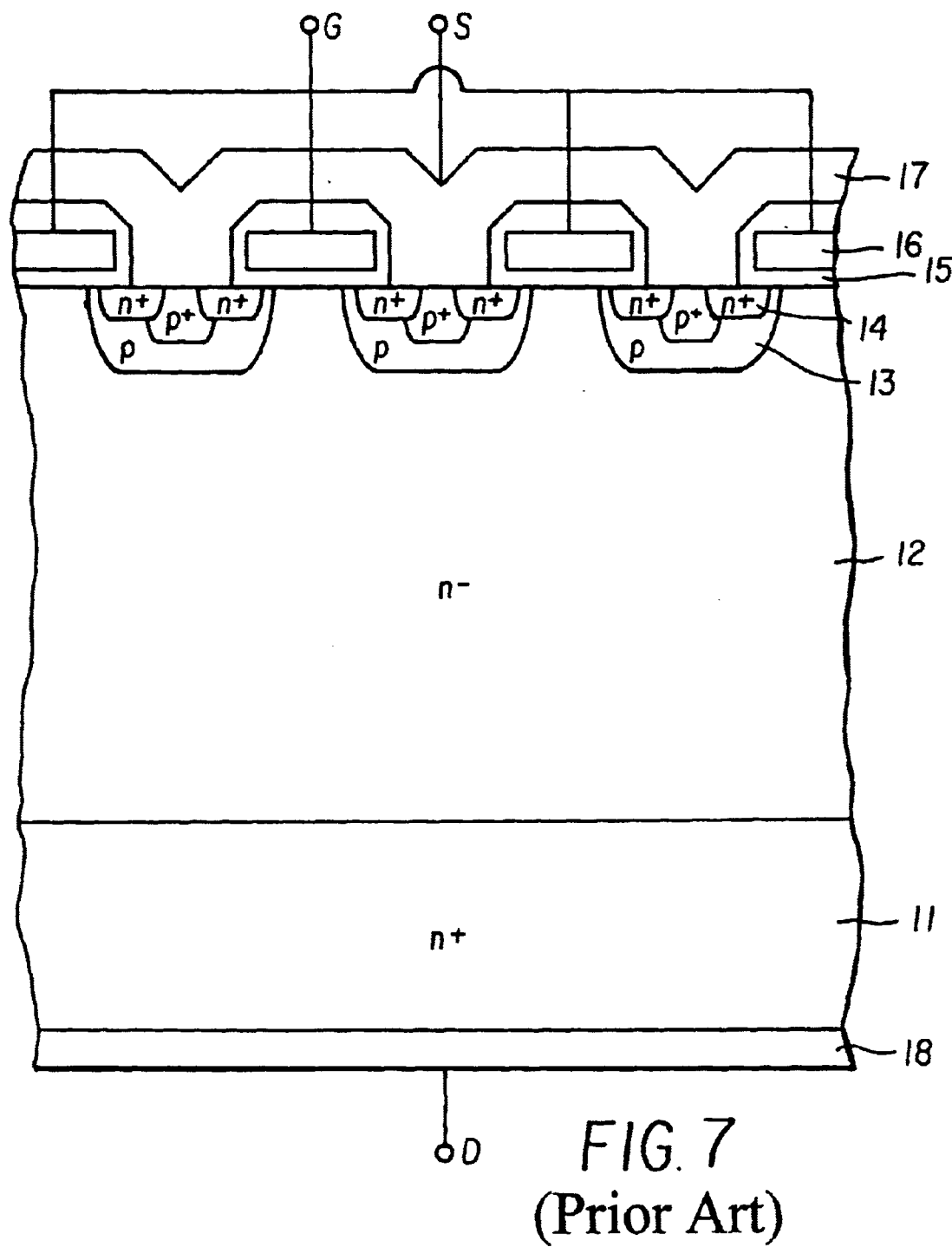

FIG. 7 is a cross sectional view of a conventional planar-type n-channel vertical MOSFET. Referring now to FIG. 7, the vertical MOSFET includes an n$^+$-type drain layer 11 with low electrical resistance, a drain electrode 18 in electrical contact with n$^+$-type drain layer 11, a highly resistive n$^-$-type drift layer 12 on n$^+$-type drain layer 11, p-type base regions 13 formed selectively in the surface portion of n$^-$-type drift layer 12, a heavily doped n$^+$-type source region 14 formed selectively in p-type base region 13, a gate insulation film 15 on the extended portion of p-type base region 13 extended between n$^+$-type source region 14 and n$^-$-type drift layer 12, a gate electrode layer 16 on gate insulation film 15, and a source electrode 17 in electrical contact commonly with n$^+$-type source regions 14 and p-type base region 13, and a drain electrode 18 on the back surface of n$^+$-type drain layer 11.

In the vertical semiconductor device shown in FIG. 7, highly resistive n$^-$-type drift layer 12 works as a region for making a drift current flow vertically when the MOSFET is in the ON-state. In the OFF-state of the MOSFET, n-type drift layer 12 is depleted, causing a high breakdown voltage. Thinning highly resistive n$^-$-type drift layer 12, that is shortening the drift current path, is effective for substantially reducing the on-resistance (resistance between the drain and the source) of the MOSFET, since the drift resistance is lowered in the ON-state of the device. However, since the space between the drain and the source, into that the depletion layers expand from the pn-junctions between p-type base regions 13 and n$^-$-type drift layer 12 in the OFF-state of the device, is narrowed by shortening the drift current path in n$^-$-type drift layer 12, the electric field strength in the depletion layers soon reaches the maximum (critical) value for silicon. Therefore, breakdown is caused before the voltage between the drain and the source reaches the designed breakdown voltage of the device.

A high breakdown voltage is obtained by thickening n$^-$-type drift layer 12. However, a thick n$^-$-type drift layer 12 inevitably causes high on-resistance and loss increase. In short, there exists a tradeoff relation between the on-resistance (current capacity) and the breakdown voltage of the MOSFET.

The tradeoff relation exists in the other semiconductor devices, such as IGBT's, bipolar transistors and diodes. The tradeoff relation exists also in the lateral semiconductor devices, therein the flow direction of the drift current in the ON-state of the devices is different from the expansion direction of the depletion layers in the OFF-state of the devices.

European Patent 0 053 854, U.S. Pat. No. 5,216,275, U.S. Pat. No. 5,438,215, and Japanese Unexamined Laid Open Patent Application H09(1997)-266311 disclose semiconductor devices, which reduce the tradeoff relation described above by employing an alternating-conductivity-type drift layer formed of heavily doped n-type regions and p-type regions alternately laminated horizontally with each other.

Figure 8:
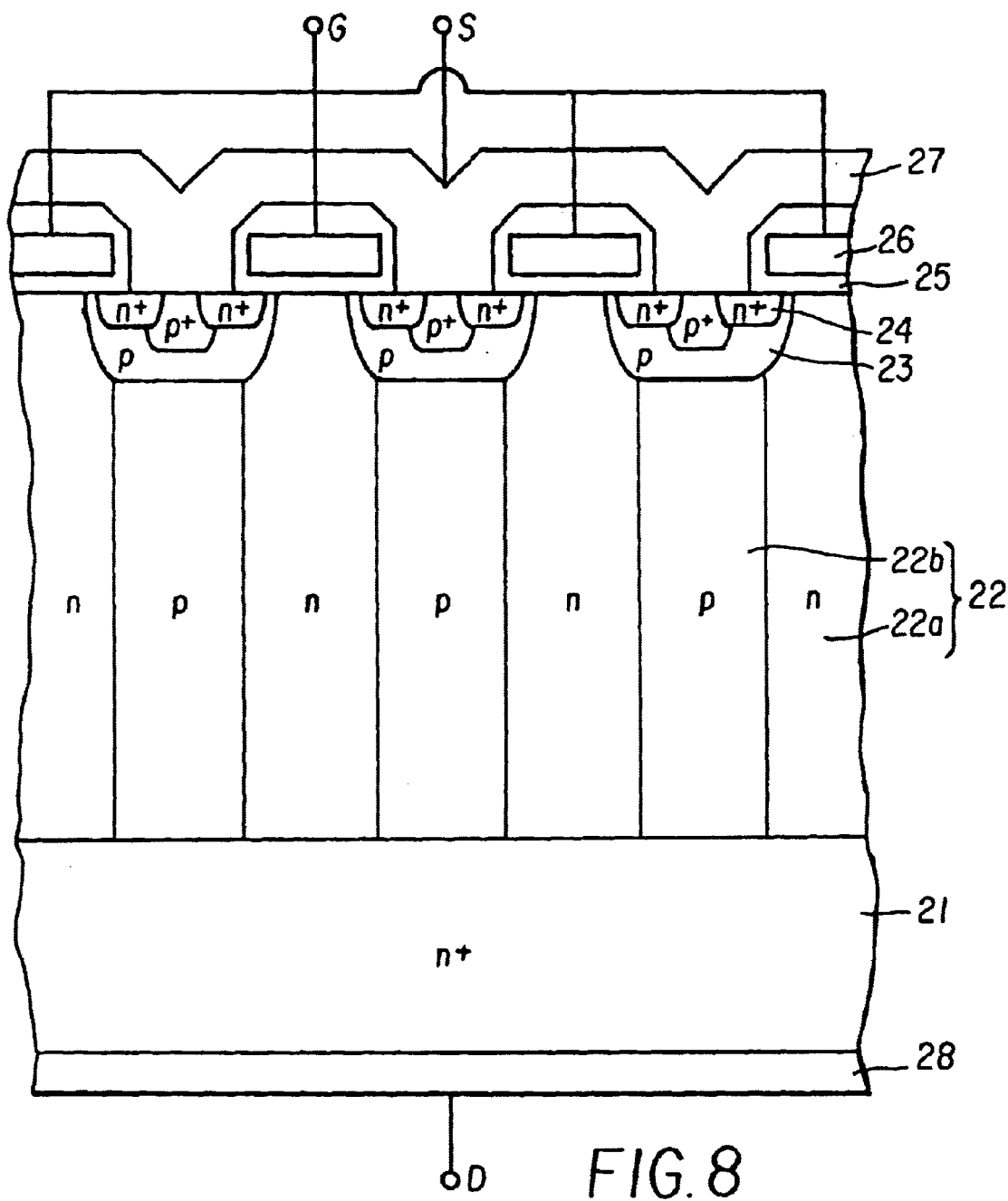

FIG. 8 is a cross sectional view of the vertical MOSFET disclosed in U.S. Pat. No. 5,216,275. Referring now to FIG. 8, the vertical MOSFET of FIG. 8 is different from the vertical MOSFET of FIG. 7 in that the vertical MOSFET of FIG. 8 includes an alternating conductivity type drift layer 22 that is not a single-layered one but formed of n-type drift regions 22a and p-type partition regions 22b alternately laminated horizontally with each other. In FIG. 8, p-type base regions 23, n$^+$-type source regions 24, gate insulation film 25, gate electrodes 26, a source electrode 27, and a drain electrode 28 are also shown.

Drift layer 22 is formed in the following way. A highly resistive n-type layer is formed epitaxially on n$^+$-type drain layer 21 as a substrate. Trenches are dug selectively in the n-type layer down to n$^+$-type drain layer 21 by etching, leaving n-type drift regions 22a. Then, p-type partition regions 22b are formed by epitaxially growing p-type layers in the trenches.

The alternating conductivity type layer provides a drift current path in the ON-state of the device and is depleted in the OFF-state of the device. Hereinafter, the semiconductor device including an alternating conductivity type drift layer will be referred to as the "super-junction semiconductor device".

The dimensions and the impurity concentrations of the constituent elements in the super-junction semiconductor device described in U.S. Pat. No. 5,216,275 are as follows. Assuming that the breakdown voltage is $V_B$, drift layer 22 is 0.024 $V_B^{1.2}$ ($\mu$m) in thickness, and n-type drift region 22a and p-type partition region 22b have the same width b and the same impurity concentration, the impurity concentrations in n-type drift region 22a and p-type partition region 22b are expressed by $7.2 \times 10^{16} V_B^{-0.2}/b (cm^{-3})$. When $V_B$=800 V and b=5 $\mu$m, drift layer 22 is 73 $\mu$m in thickness and the impurity concentration thereof is $1.9 \times 10^{16}$ cm$^{-3}$. Obviously, the alternating conductivity type drift layer reduces the on-resistance, since the impurity concentration in the single-layered drift layer is around $2 \times 10^{14}$ cm$^{-3}$. However, it is very difficult for the epitaxial growth technique available at present to bury semiconductor layers with a good quality in such narrow and deep trenches, that is trenches with a large aspect ratio.

As described above, the tradeoff relation between the on-resistance and the breakdown voltage poses a problem also on the lateral semiconductor devices. European Patent 0 053 854, U.S. Pat. No. 5,438,215, and Japanese Unexamined Laid Open Patent Application H09(1997)-266311 disclose also lateral super-junction semiconductor devices and the methods of manufacturing the lateral super-junction semiconductor devices. The disclosed methods employ selective etching to dig trenches and epitaxial growth to bury the trenches. It is not so difficult for the selective etching technique and the epitaxial growth technique to form the alternating-conductivity-type drift layer for the lateral super-junction semiconductor device, since the lateral alternating-conductivity-type drift layer is formed by laminating thin epitaxial layers vertically.

However, the conventional selective etching and epitaxial growth techniques are not so effective to form the vertical alternating-conductivity-type drift layer described in U.S. Pat. No. 5,216,275. Japanese Unexamined Laid Open Patent Application H09(1997)-266311 describes a nuclear transformation technique that uses a neutron beam and such a radioactive ray for forming n-type regions and p-type regions in the alternating-conductivity-type drift layer. However, it is not so easy to apply the nuclear transformation technique which employs large facilities.

For reducing the chip size of the conventional super-junction semiconductor device, it is necessary to reduce the dimensions of the constituent layers and regions constituting the surface semiconductor structure of the device. The reduced dimensions inevitably lower the mass-productivity of the device. Change of the surface structure causes additional manufacturing costs.

In view of the foregoing, it would be desirable to provide a super-junction semiconductor device that facilitates reducing the tradeoff relation between the on-resistance and the breakdown voltage, obtaining a high breakdown voltage and reducing the on-resistance to increase the current capacity. It would further be desirable to provide the method for manufacturing a super-junction semiconductor device easily with excellent mass-productivity.

SUMMARY OF THE INVENTION

According to an aspect of the invention, there is provided a semiconductor device including: a semiconductor chip having a first major surface and a second major surface facing in opposite to the first major surface; a layer with low electrical resistance on the side of the second major surface; a first alternating conductivity type layer above the layer with low electrical resistance, the first alternating conductivity type layer including one or more first regions of a first conductivity type and second regions of a second conductivity type, the one or more first regions and the second regions forming first pn-junctions therebetween; and a second alternating conductivity type layer in plane contact with the first alternating conductivity type layer, the second alternating conductivity type layer including one or more third regions of the first conductivity type and fourth regions of the second conductivity type, the one or more third regions and the fourth regions forming second pn-junctions therebetween; the second pn-junctions in the second alternating conductivity type layer being spaced apart from each other more widely than the first pn-junctions in the first alternating conductivity type layer.

Advantageously, the boundary between the first alternating conductivity type layer and the second alternating conductivity type layer extends almost in parallel to the first major surface.

Advantageously, the second alternating conductivity type layer is between the first alternating conductivity type layer and the first major surface.

Advantageously, the surfaces of the first pn-junctions in the first alternating conductivity type layer are almost perpendicular to surfaces of the second pn-junctions in the second alternating conductivity type layer.

Advantageously, the one or more first regions of the first conductivity type in the first alternating conductivity type layer are connected to the one or more third regions of the first conductivity type in the second alternating conductivity type layer, and the second regions of the second conductivity type in the first alternating conductivity type layer are connected to the fourth regions of the second conductivity type in the second alternating conductivity type layer.

Advantageously, the one or more third regions and the fourth regions in second alternating conductivity type layer are arranged differently from the one or more first regions and the second regions in first alternating conductivity type layer.

The super-junction semiconductor device according to the invention, in that the spacing between the second pn-junctions in the second alternating conductivity type layer is wider than the spacing between the first pn-junctions in the first alternating conductivity type layer, facilitates reducing the on-resistance without condensing the surface structure of the semiconductor chip and, therefore, without increasing the manufacturing costs. Even when the boundary between the first alternating conductivity type layer and the second alternating conductivity type layer extends in perpendicular to the first major surface, the on-resistance is reduced without condensing the surface structure of the semiconductor chip. Since the super-junction semiconductor device according to the invention reduces the on-resistance simply by narrowing the spacing between the pn-junctions in the alternating conductivity type layer inside the semiconductor chip, the costs of mass-producing the super-junction semiconductor device are reduced.

According to another aspect of the invention, there is provided the method of manufacturing a semiconductor device including a semiconductor chip having a first major surface and a second major surface facing in opposite to the first major surface; a layer with low electrical resistance on the side of the second major surface; a first alternating conductivity type layer above the layer with low electrical resistance, the first alternating conductivity type layer being formed of one or more first regions of a first conductivity type and second regions of a second conductivity type, the one or more first regions and the second regions forming first pn-junctions therebetween; and a second alternating conductivity type layer in plane contact with the first alternating conductivity type layer, the second alternating conductivity type layer being formed of one or more third regions of the first conductivity type and fourth regions of the second conductivity type, the one or more third regions and the fourth regions forming second pn-junctions therebetween; the second pn-junctions in the second alternating conductivity type layer being spaced apart from each other more widely than the first pn-junctions in the first alternating conductivity type layer, the method including the steps of: (a) forming an epitaxial layer; (b) implanting an impurity of the second conductivity type selectively into first surface portions of the epitaxial layer; (c) implanting an impurity of the first conductivity type selectively into second surface portions of the epitaxial layer; (d) repeating the steps (a) through (c) as many times as necessary; and (e) thermally driving all the implanted impurities, whereby to form the first alternating conductivity type layer and the second alternating conductivity type layer. Preferably, the steps (a) through (c) are repeated three times or more.

The method of manufacturing the super-junction semiconductor device according to the invention facilitates changing the spacing between the pn-junctions in the second alternating conductivity type layer on the side of the first major surface form the spacing between the pn-junctions in the first alternating conductivity type layer on the side of the second major surface. In other words, the method of manufacturing the super-junction semiconductor device according to the invention facilitates reducing the on-resistance simply by narrowing the spacing between the pn-junctions in the alternating conductivity type layer inside the semiconductor chip. Therefore, the method of manufacturing the super-junction semiconductor device according to the invention is effective to reduce the costs of mass-producing the super-junction semiconductor devices.

BRIEF DESCRIPTION OF THE DRAWING FIGURES

Figure 2A:
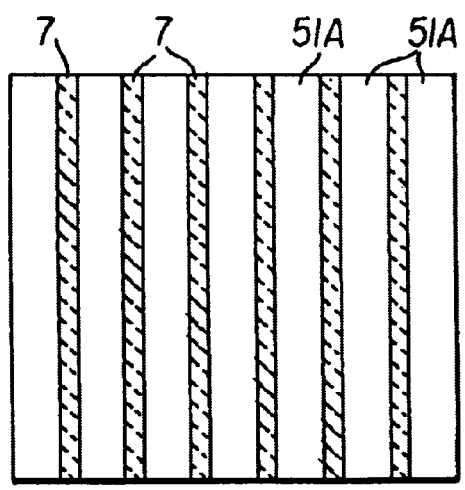
Figure 2B:
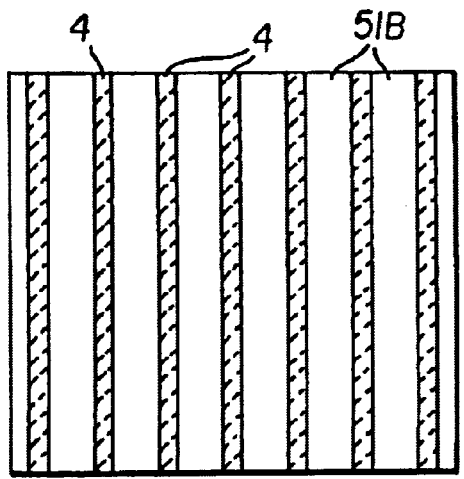
Figure 2C:
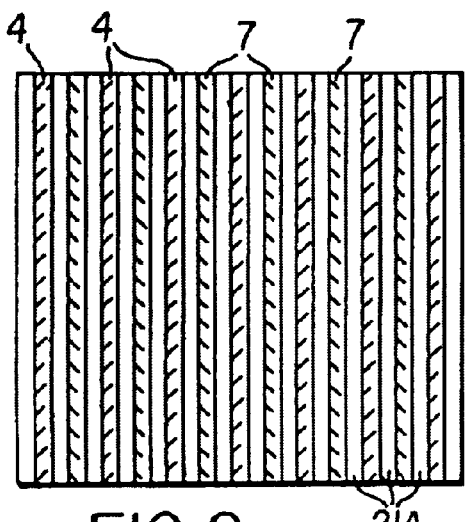
Figure 2D:
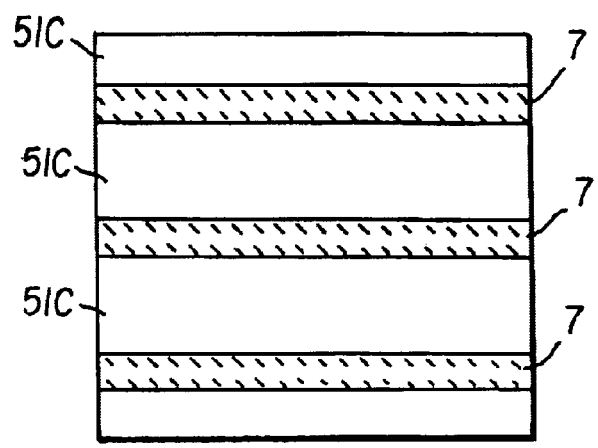
Figure 2E:
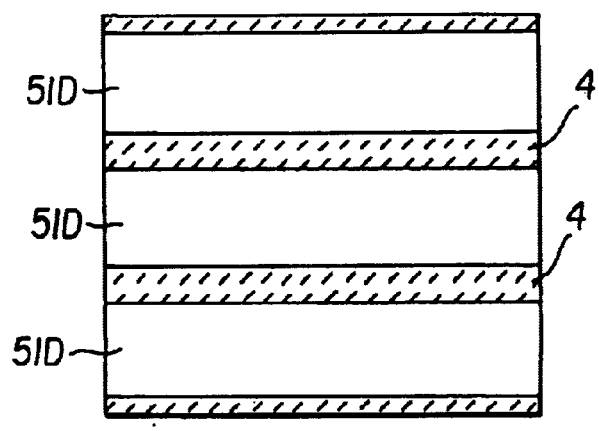
Figure 2F:
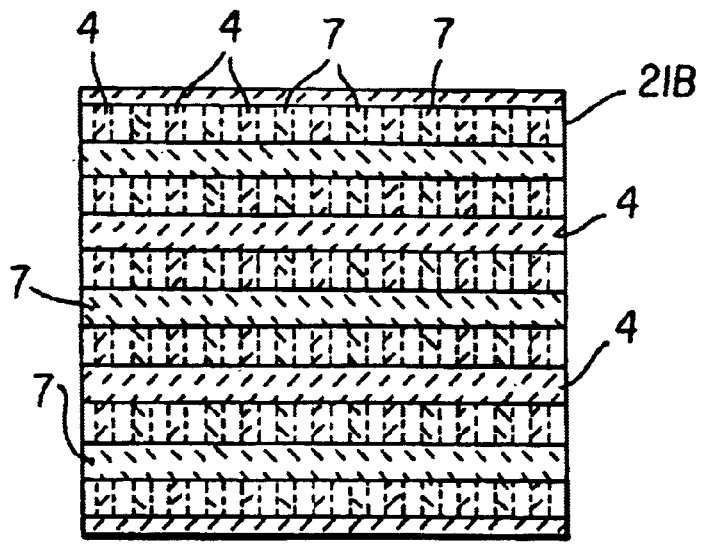
Figure 2G:
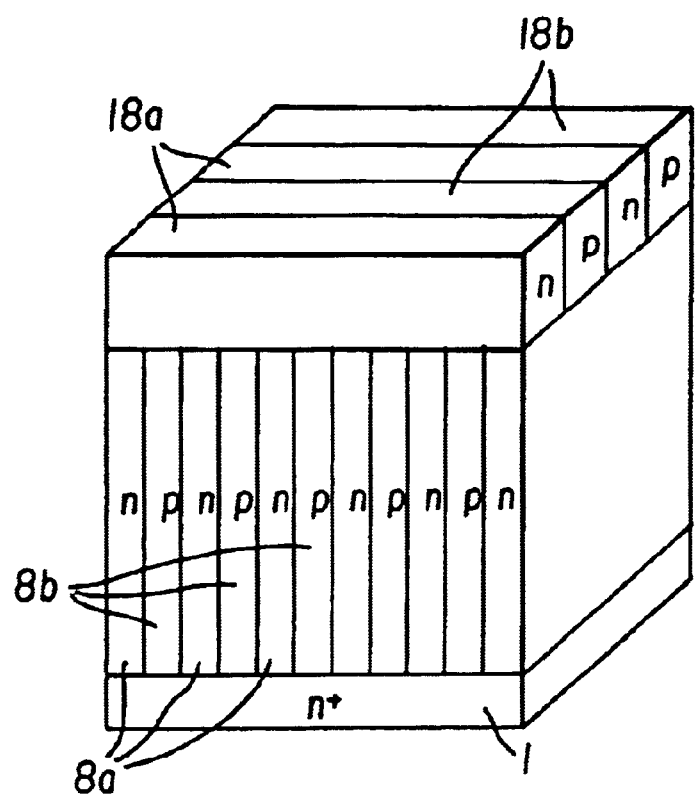
Figure 3A:
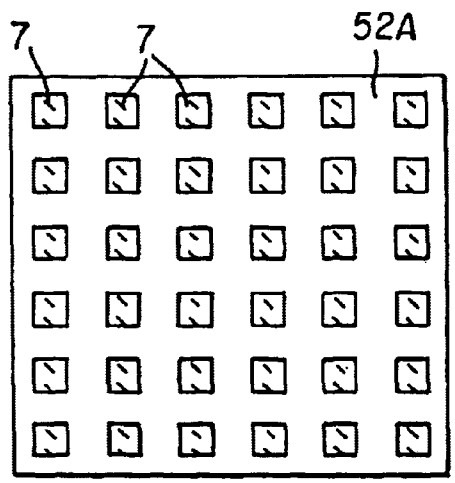
Figure 3D:
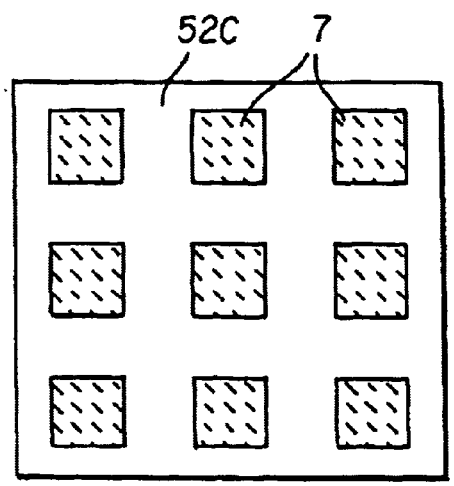
Figure 3B:
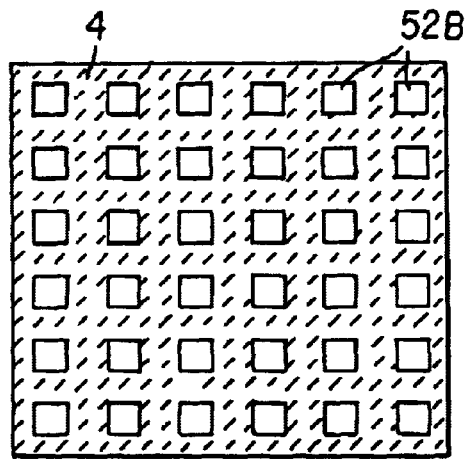
Figure 3E:
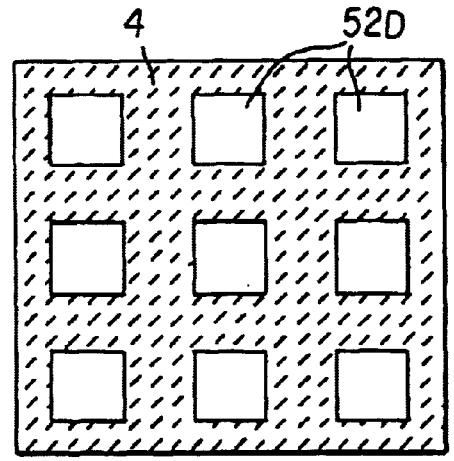
Figure 3C:
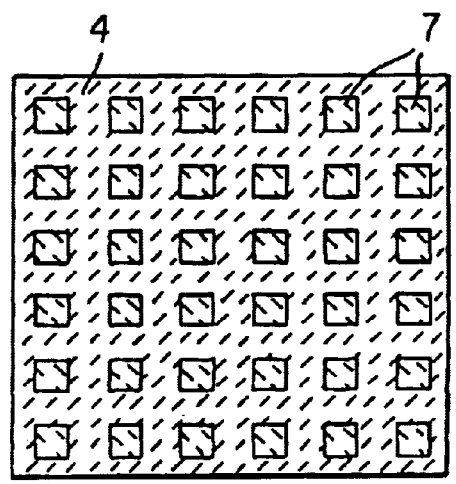
Figure 3F:
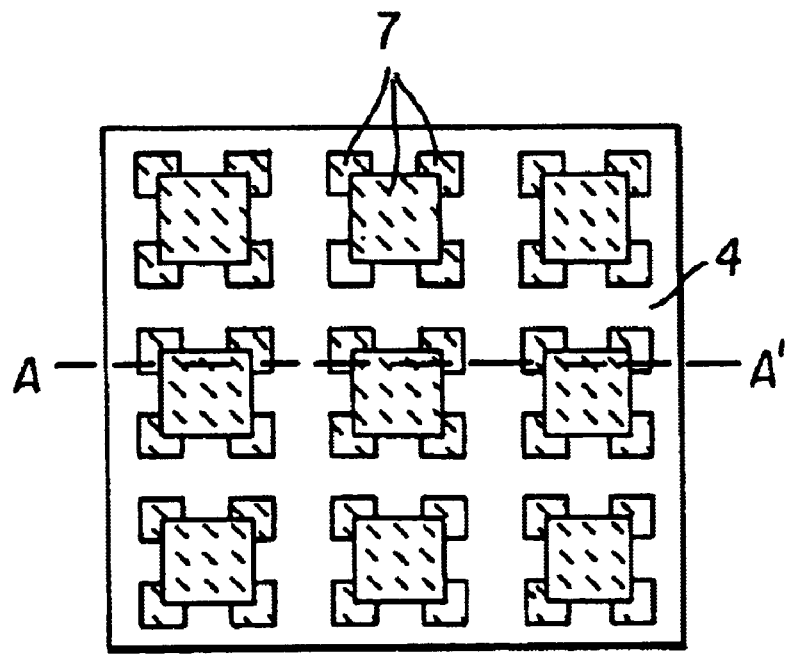
Figure 3G:
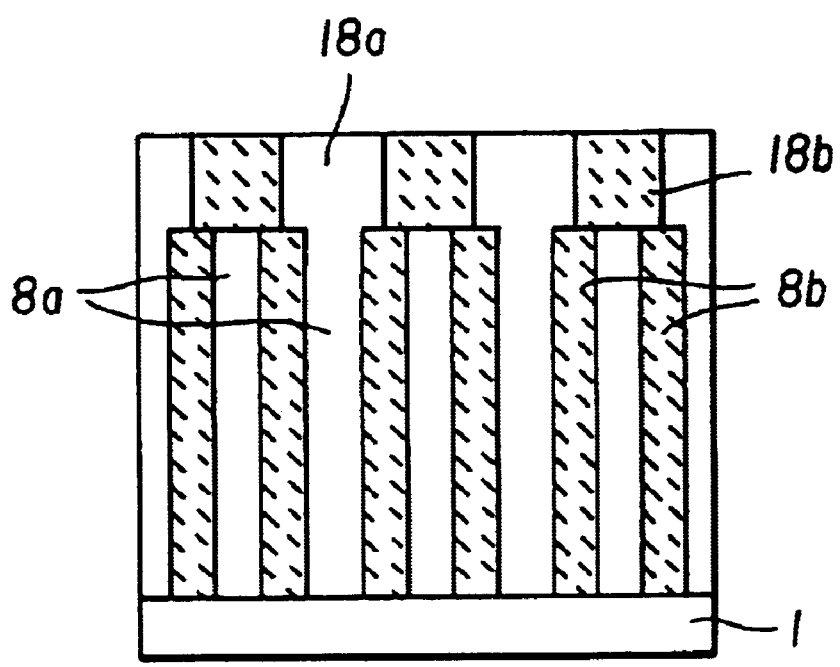
Figure 4A:
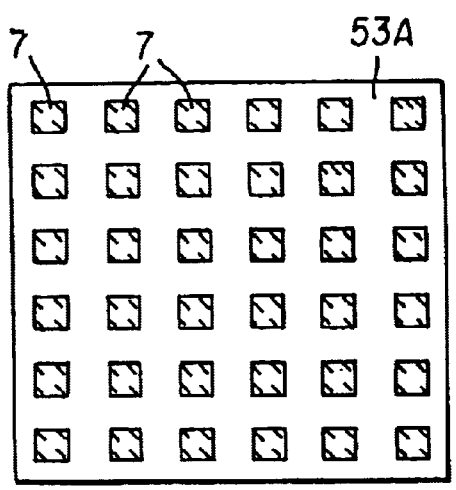
Figure 4D:
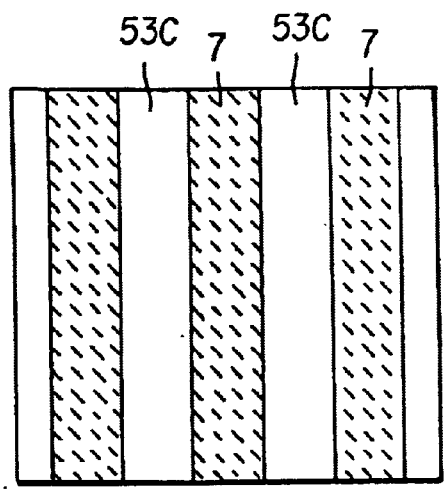
Figure 4B:
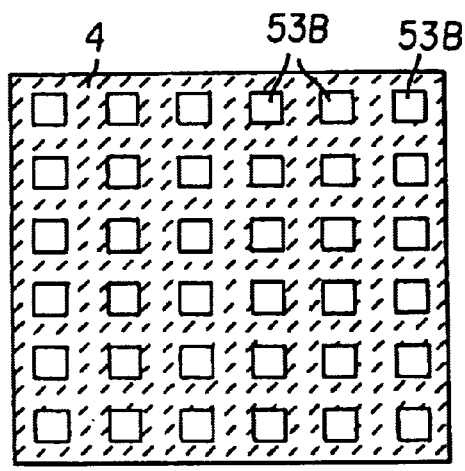
Figure 4E:
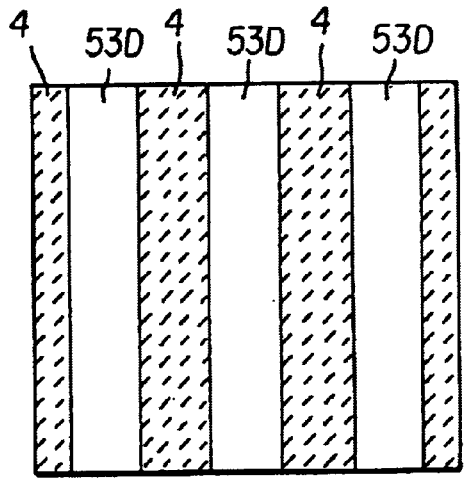
Figure 4C:
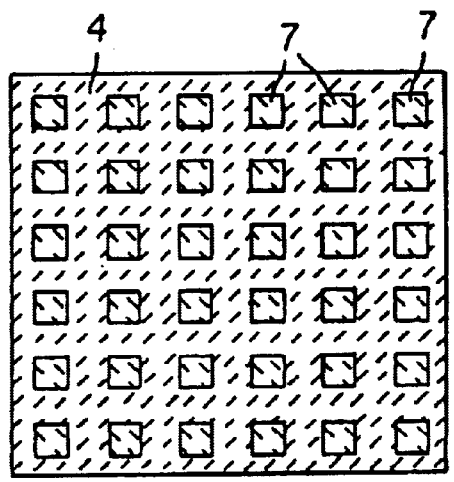
Figure 4F:
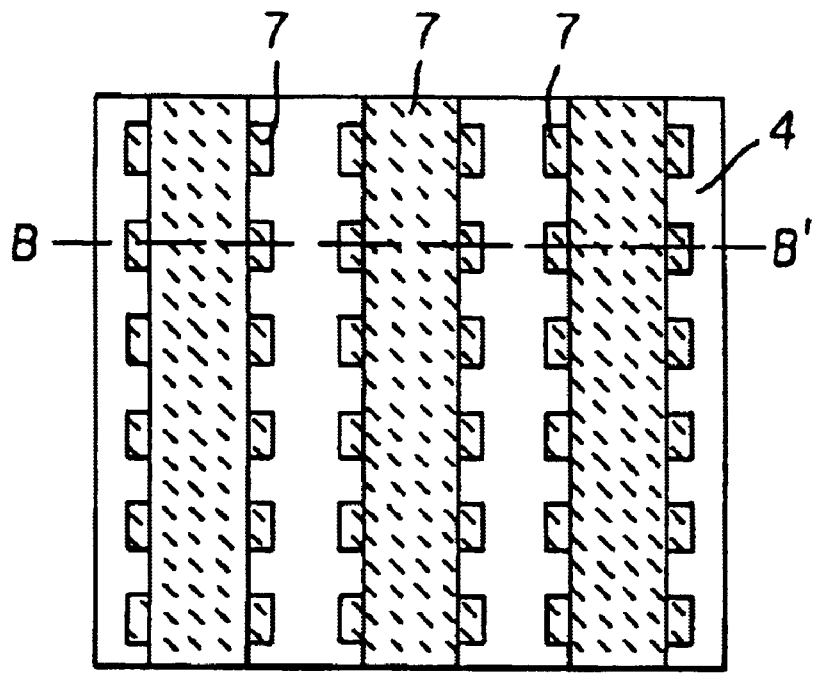
Figure 4G:
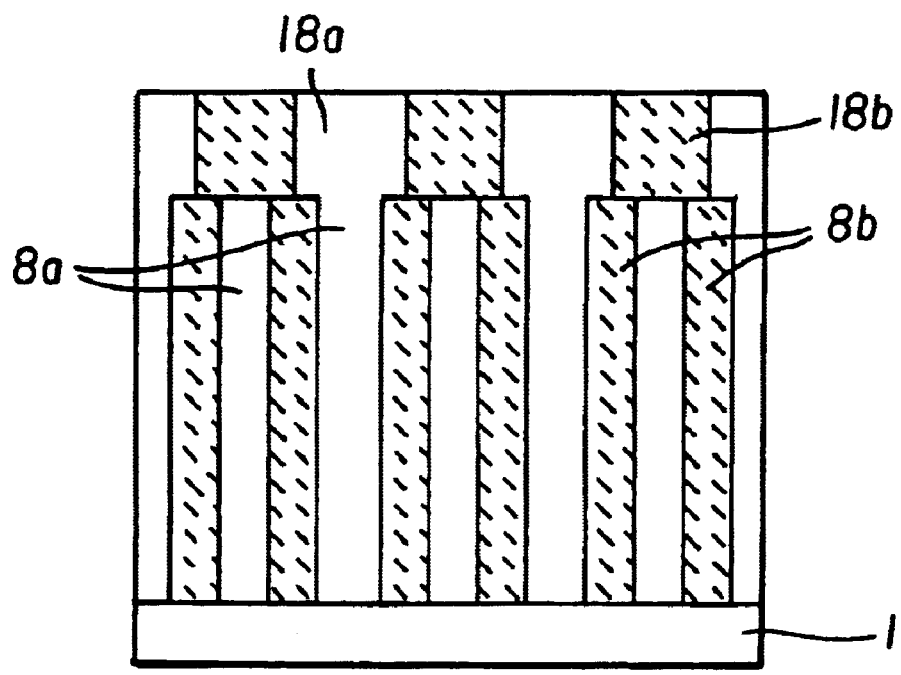
Figure 6:
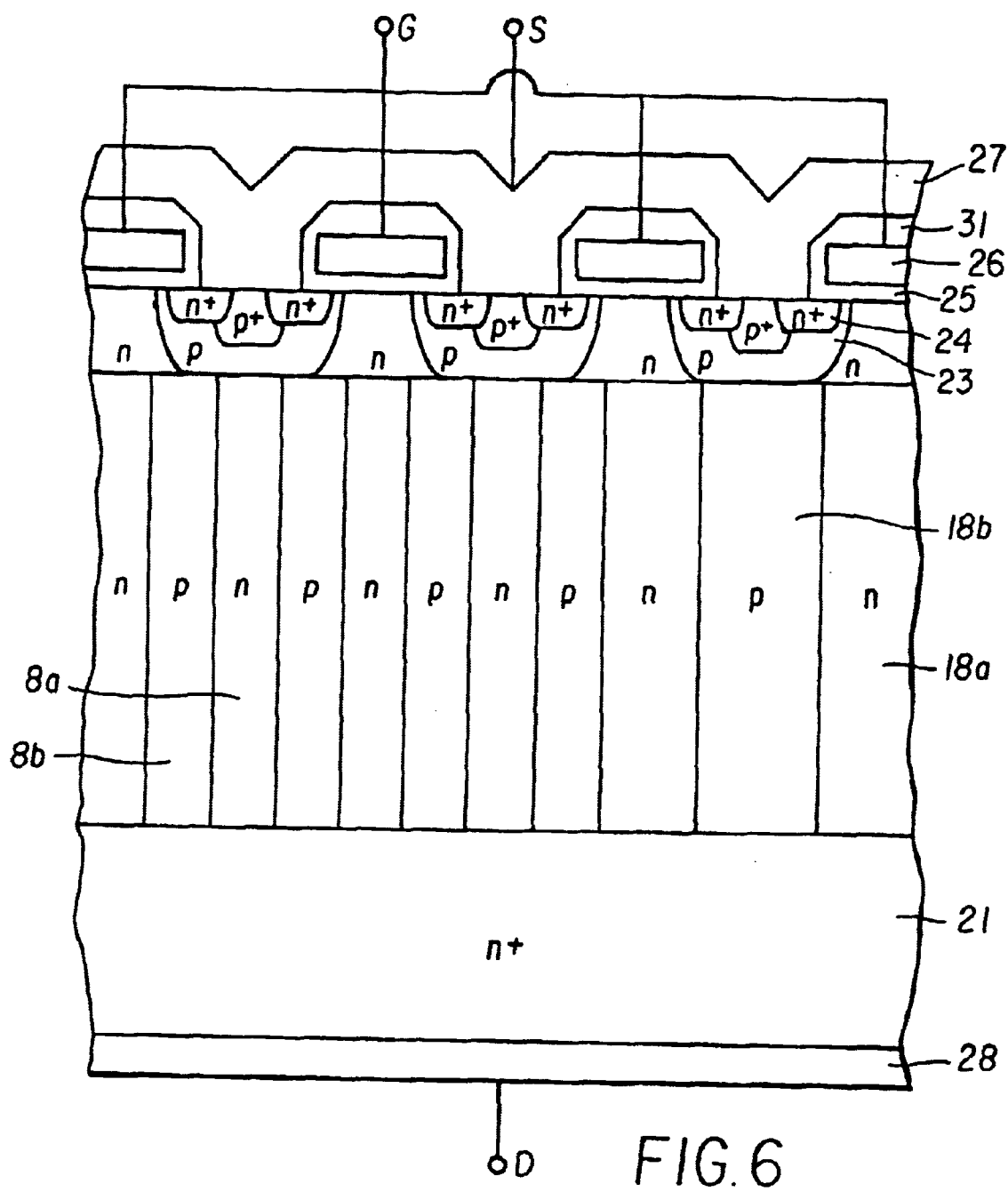

The invention will be described with reference to certain preferred embodiments and the accompanying drawings, wherein:

FIGS. 1(a) through 1(i) are cross sectional views for explaining the steps for manufacturing a super-junction semiconductor device according to the first embodiment of the invention;

FIGS. 2(a) through 2(f) are top plan views for explaining the steps for manufacturing a super-junction semiconductor device according to the second embodiment of the invention;

FIG. 2(g) is a perspective view of the super-junction semiconductor device according to the second embodiment of the invention;

FIGS. 3(a) through 3(f) are top plan views for explaining the steps for manufacturing a super-junction semiconductor device according to the third embodiment of the invention;

FIG. 3(g) is a vertical cross section along A–A' of FIG. 3(f);

FIGS. 4(a) through 4(f) are top plan views for explaining the steps for manufacturing a super-junction semiconductor device according to the fourth embodiment of the invention;

FIG. 4(g) is a vertical cross section along B–B' of FIG. 4(f);

FIGS. 5(a) through 5(f) are cross sectional views for explaining the steps for manufacturing a super-junction semiconductor device according to the fifth embodiment of the invention;

FIG. 6 is a cross sectional view of the super-junction semiconductor device according to the fifth embodiment of the invention;

FIG. 7 is a cross sectional view of a conventional planar-type n-channel vertical MOSFET; and FIG. 8 is a cross sectional view of the vertical MOSFET disclosed in U.S. Pat. No. 5,216,275.

DETAILED DESCRIPTION OF THE PREFERRED EMBODIMENTS

The present invention provides a super-junction semiconductor device that includes a semiconductor chip having a first major surface and a second major surface. The semiconductor chip includes a layer with low electrical resistance on the side of the second major surface and two or more alternating conductivity type layers between the layer with low electrical resistance and the first major surface. Each alternating conductivity type layer includes one or more regions of a first conductivity type and regions of a second conductivity type spaced apart from each other by the one or more regions of the first conductivity type. The alternating conductivity type layers provide a drift current path in the ON-state of the device and are depleted in the OFF-state of the device.

First Embodiment

FIGS. 1(a) through 1(i) are cross sectional views explaining the steps for manufacturing a super-junction semiconductor device according to a first embodiment of the invention employing the ion implantation technique.

The super-junction semiconductor device according to the first embodiment includes a first alternating conductivity type layer on a layer with low electrical resistance and a second alternating conductivity type layer on the first alternating conductivity type layer. The spacing between the pn-junctions in the second alternating conductivity type layer is wider than the spacing between the pn-junctions in the first alternating conductivity type layer. The regions of the first conductivity type and the regions of the second conductivity type in the second alternating conductivity type layer are extended in parallel to the regions of the first conductivity type and the regions of the second conductivity type in the first alternating conductivity type layer.

Figure 1A:
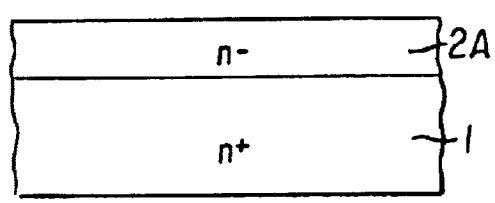

Referring now to FIG. 1(a), a highly resistive $n^-$-type layer 2A is deposited epitaxially on an n-type substrate 1 with low electrical resistance. The $n^-$-type layer 2A is 4 $\mu$m in thickness.

Figure 1B:
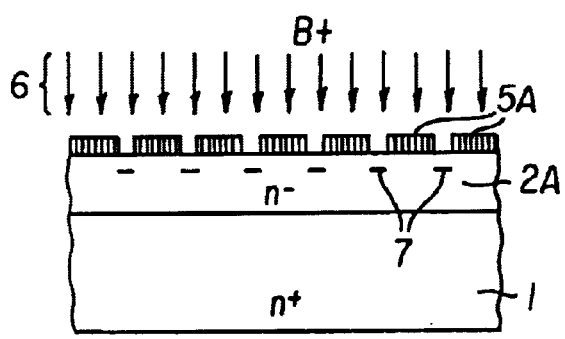

Referring now to FIG. 1(b) a resist mask 5A is formed on $n^-$-type layer 2A by photolithography. Boron ions 6 are implanted as p-type impurity ions into first surface portions of $n^-$-type layer 2A at the dose amount of $2\times10^{13}$ cm$^{-2}$ of boron atoms 7. Resist mask 5A includes first windows, through which boron ions 6 are implanted. The first windows are 2 $\mu$m in width and spaced apart for 6 $\mu$m from each other.

Figure 1E:
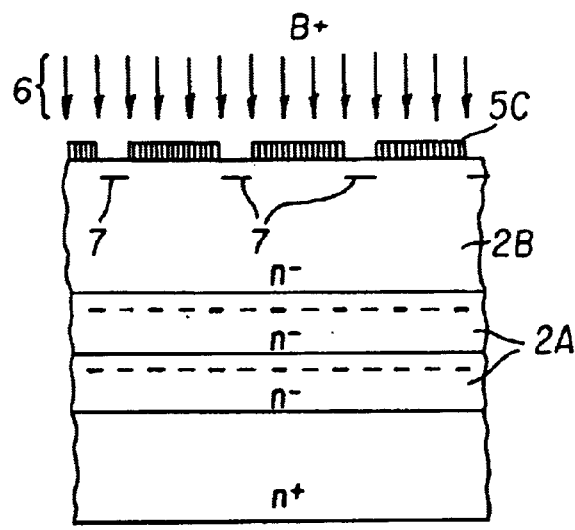
Figure 1C:
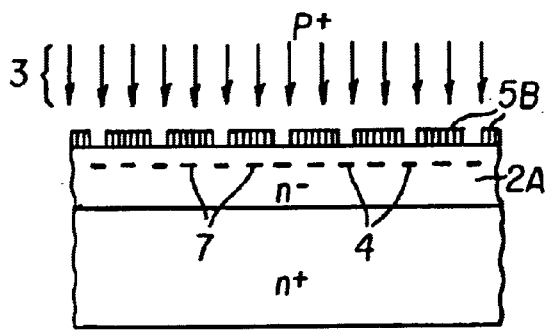

Referring now to FIG. 1(c), resist mask 5A is removed. Then, a resist mask 5B having second windows is formed on $n^-$-type layer 2A by photolithography such that the second windows are at the midpoints between the first windows of resist mask 5A. The second windows of resist mask 5B are 2 $\mu$m in width and spaced apart for 6 $\mu$m from each other. Phosphorus ions 3 are implanted as n-type impurity ions through the second windows into second surface portions of $n^-$-type layer 2A at the dose amount of $2\times10^{13}$ cm$^{-2}$ of phosphorus atoms 4.

Figure 1F:
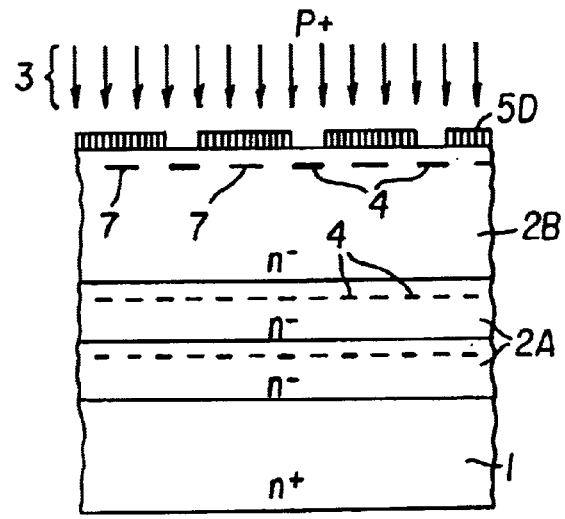
Figure 1D:
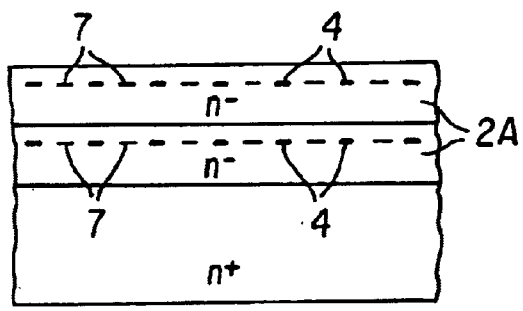

Referring now to FIG. 1(d), the steps described above with reference to FIGS. 1(a) through 1(c) are repeated as many times as necessary.

Referring now to FIG. 1(e) resist mask 5B is removed. A highly resistive $n^-$-type layer 2B of 6 $\mu$m in thickness is deposited epitaxially on the uppermost $n^-$-type layer 2A. Then, a resist mask 5C having third windows is formed on $n^-$-type layer 2B by photolithography. Boron ions 6 are implanted through the third windows into first surface portions of $n^-$-type layer 2B at the dose amount of $1\times10^{13}$ cm$^{-2}$ of boron atoms 7. The third windows in resist mask 5C are wider than the first windows in FIG. 1(b) or the second windows in FIG. 1(c) and spaced apart from each other more widely than the first windows or the second windows. More in detail, third windows in resist mask 5C are 4 $\mu$m in width and spaced apart for 12 $\mu$m from each other. The third windows in resist mask 5C are positioned above every other location of the first windows in resist mask 5A.

Referring now to FIG. 1(f), resist mask 5C is removed. Then, a resist mask 5D having fourth windows is formed on $n^-$-type layer 2B by photolithography such that the fourth windows are at the midpoints between the third windows of resist mask 5C. The fourth windows in resist mask 5D are 4 µm in width and spaced apart for 12 µm from each other. Phosphorus ions 3 are implanted through the fourth windows into second surface portions of n⁻-type layer 2B at the dose amount of 1×10¹³ cm⁻² of phosphorus atoms 4. Resist mask 5D is patterned in such a way that the pattern of resist mask 5D is a displacement of the pattern of resist mask 5C. The fourth windows in resist mask 5D are positioned above the centers of the spaces between the third windows in resist mask 5C.

Figure 1G:
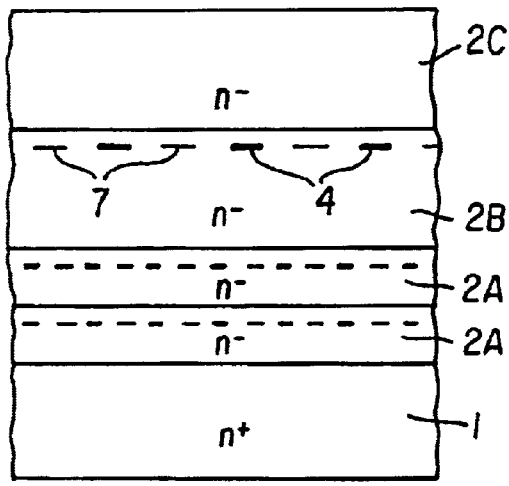

Referring now to FIG. 1(g), resist mask 5D is removed. A highly resistive n⁻-type layer 2C of 8 µm in thickness is deposited epitaxially on n⁻-type layer 2B.

Figure 1I:
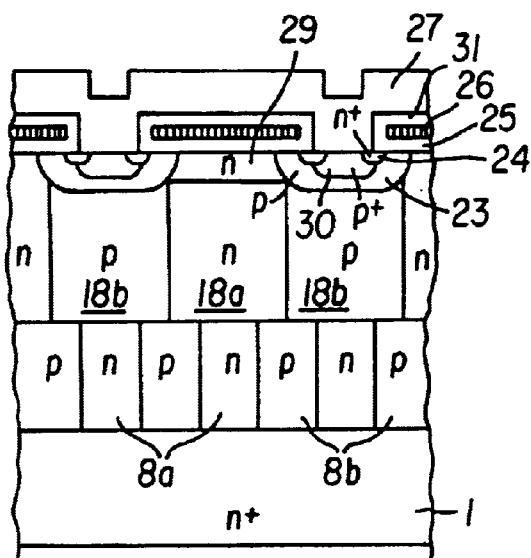
Figure 1H:
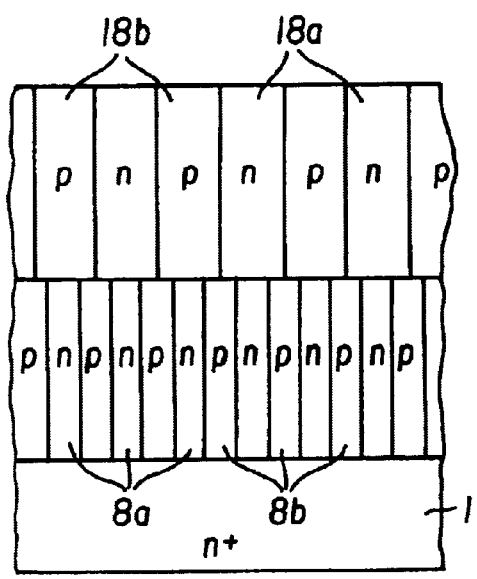

Referring now to FIG. 1(h), a first alternating conductivity type layer and a second alternating conductivity type layer on the first alternating conductivity type layer are formed by thermally treating the laminate including n⁻-type layers 2A, 2B and 2C formed so far at 1150° C. for 20 hours to drive all the implanted impurity atoms. The first alternating conductivity type layer is formed of n-type drift regions 8a and p-type partition regions 8b arranged alternately with each other. The second alternating conductivity type layer is formed of n-type drift regions 18a and p-type partition regions 18b arranged alternately with each other.

Referring now to FIG. 1(i), n-type drain regions 29 are formed on n-type drift regions 18a and p-type partition regions 18b. Then, a surface MOSFET structure is formed through the conventional steps of forming the MOSFET structure.

More in detail, n-type drain regions 29 are formed in the surface portion of the semiconductor chip by selective implanting impurity ions and by thermally driving the implanted impurity atoms. Gate insulation films 25 are formed by thermal oxidation. A polycrystalline silicon film is deposited by the vacuum CVD method and gate electrode layers 26 are formed by patterning the deposited polycrystalline silicon film by photolithography. Then, p-type base regions 23, n⁺-type source regions 24 and p⁺-type contact regions 30 are formed by selective implanting impurity ions and by thermally driving the implanted impurity atoms. Then, an insulation film 31 is deposited and windows are opened through insulation film 31 by photolithography. Aluminum alloy films are deposited. A source electrode 27, a drain electrode 28 and not shown gate electrodes are formed by patterning the deposited aluminum alloy films. Thus, a MOSFET is obtained.

Second Embodiment

FIGS. 2(a) through 2(f) are top plan views for explaining the steps for manufacturing a super-junction semiconductor device according to a second embodiment of the invention. FIG. 2(g) is a perspective view of the super-junction semiconductor device according to the second embodiment of the invention.

The super-junction semiconductor device according to the second embodiment includes a first alternating conductivity type layer on a layer with low electrical resistance and a second alternating conductivity type layer on the first alternating conductivity type layer. The spacing between the pn-junctions in the second alternating conductivity type layer is wider than the spacing between the pn-junctions in the first alternating conductivity type layer. The regions of the first conductivity type and the regions of the second conductivity type in the second alternating conductivity type layer are extended in perpendicular to the regions of the first conductivity type and the regions of the second conductivity type in the first alternating conductivity type layer.

Referring at first to FIG. 2(c), a highly resistive n⁻-type layer 21A is deposited epitaxially on an n-type substrate with low electrical resistance. The n⁻-type layer 21A is 4 µm in thickness.

Referring now to FIG. 2(a), a resist mask 51A is formed on n⁻-type layer 21A by photolithography. Boron ions are implanted into first surface portions of n⁻-type layer 21A at the dose amount of 2×10¹³ cm⁻² of boron atoms 7. Resist mask 51A includes first windows, through which boron ions are implanted. The first windows are 2 µm in width and spaced apart for 6 µm from each other.

Referring now to FIG. 2(b), resist mask 51A is removed. Then, a resist mask 51B having second windows is formed on n⁻-type layer 21A by photolithography such that the second windows are at the midpoints between the first windows of resist mask 51A Phosphorus ions are implanted through the second windows into second surface portions of n⁻-type layer 2A at the dose amount of 2×10¹³ cm⁻² of phosphorus atoms 4. The second windows are 2 µm in width and spaced apart for 6 µm from each other.

Referring now to FIG. 2(c), the steps of the epitaxial growth and the boron ion implantation described above with reference to FIG. 2(a) and the step of phosphorus ion implantation described above with reference to FIG. 2(b) are repeated as many times as necessary.

Referring now to FIG. 2(f), resist mask 51B is removed. A highly resistive n⁻-type layer 21B of 6 µm in thickness is deposited epitaxially on the uppermost n⁻-type layer 2A.

Referring now to FIG. 2(d), a resist mask 5C having third windows is formed on n⁻-type layer 21B by photolithography. Boron ions are implanted through the third windows into first surface portions of n⁻-type layer 21B at the dose amount of 1×10¹³ cm⁻² of boron atoms 7. Resist mask 51C is positioned such that the third windows thereof extend in perpendicular to the first windows or the second windows of the preceding resist mask 51A or 51B. The third windows in resist mask 51C are wider than the first windows shown in FIG. 2(a) or the second windows in FIG. 2(b) and spaced apart from each other more widely than the first windows or the second windows. More in detail, third windows in resist mask 51C are 4 µm in width and spaced apart for 12 µm from each other.

Referring now to FIG. 2(e), resist mask 5C is removed. Then, a resist mask 51D having fourth windows is formed on if-type layer 21B by photolithography such that the fourth windows are at the midpoints between the third windows of resist mask 51C. The fourth windows in resist mask 5D are 4 µm in width and spaced apart for 12 µm from each other. Phosphorus ions are implanted through the fourth windows into second surface portions of if-type layer 21B at the dose amount of 1×10¹³ cm⁻² of phosphorus atoms 4. Resist mask 51D is patterned in such a way that the pattern of resist mask 51D is a displacement of the pattern of resist mask 51C. The fourth windows in resist mask 51D are positioned above the centers of the spaces between the third windows in resist mask 51C.

Referring now to FIG. 2(f), resist mask 51D is removed. A highly resistive n⁻-type layer 21B of 8 µm in thickness is deposited epitaxially on n⁻-type layer 2B.

Referring back to FIG. 1(g), a first alternating conductivity type layer and a second alternating conductivity type layer on the first alternating conductivity type layer are formed by thermally treating the laminate including n⁻-type layers 21A and 21B formed so far at 1150° C. for 20 hours to drive all the implanted impurity atoms. The first alternating conductivity type layer is formed of n-type drift regions 8a and p-type partition regions 8b arranged alternately with each other. The second alternating conductivity type layer is formed of n-type drift regions 18a and p-type partition regions 18b arranged alternately with each other.

Then, a surface MOSFET structure is formed in the same way as according to the first embodiment through the conventional steps of forming the MOSFET structure.

Third Embodiment

FIGS. 3(a) through 3(f) are top plan views for explaining the steps for manufacturing a super-junction semiconductor device according to a third embodiment of the invention. FIG. 3(g) is a vertical cross section along A–A' of FIG. 3(f).

The super-junction semiconductor device according to the third embodiment includes a first alternating conductivity type layer on a layer with low electrical resistance and a second alternating conductivity type layer on the first alternating conductivity type layer. The first alternating conductivity type layer includes columnar regions of the second conductivity type and a region of the first conductivity type filling the space between the columnar regions of the second conductivity type. And, the second alternating conductivity type layer includes columnar regions of the second conductivity type and a region of the first conductivity type filling the space between the columnar regions of the second conductivity type. The spacing between the pn-junctions in the second alternating conductivity type layer is wider than the spacing between the pn-junctions in the first alternating conductivity type layer.

Referring now to FIG. 3(a), a highly resistive n⁻-type layer is deposited epitaxially on an n-type substrate with low electrical resistance. The n⁻-type epitaxial layer is 4 μm in thickness.

A resist mask 52A is formed on the n⁻-type epitaxial layer by photolithography. Boron ions as p-type impurity ions are implanted into first surface portions of the n⁻-type epitaxial layer at the dose amount of $1.2 \times 10^{14}$ cm⁻² of boron atoms 7. Resist mask 52A includes first square windows, through which boron ions are implanted. The first square windows are 2 μm×2 μm in area and spaced apart for 2 μm from each other. In other words, the first square windows of 2 μm×2 μm in area are aligned at the pitch of 4 μm.

Referring now to FIG. 3(b), resist mask 52A is removed. Then, resist masks 52B are formed by photolithography on the portions of the n⁻-type epitaxial layer, thereon the first square windows of resist mask 52A were positioned. Phosphorus ions are implanted as n-type impurity ions into a second surface portion of the n⁻-type epitaxial layer at the dose amount of $4 \times 10^{13}$ cm⁻² of phosphorus atoms 4.

Referring now to FIG. 3(c), the steps described above with reference to FIGS. 3(a) and 3(b) are repeated as many times as necessary.

Referring now to FIG. 3(d), resist masks 52B are removed. A highly resistive n⁻-type layer of 6 μm in thickness is deposited epitaxially on the uppermost n⁻-type epitaxial layer. Then, a resist mask 52C having second square windows is formed on the uppermost n⁻-type epitaxial layer by photolithography. Boron ions are implanted through the second square windows into first surface portions of the uppermost n⁻-type layer at the dose amount of $3 \times 10^{13}$ cm⁻² of boron atoms 7. The second windows in resist mask 52C are 4 μm×4 μm in area and aligned at the pitch of 8 μm. Resist mask 52C is positioned such that the resulting columnar p-type regions in the second alternating conductivity type layer are connected to the resulting columnar p-type regions in the first alternating conductivity type layer.

Referring now to FIG. 3(e), resist mask 52C is removed. Then, resist masks 52D are formed by photolithography on the portions of the uppermost n⁻-type epitaxial layer, thereon the second square windows of resist mask 52C were positioned. Phosphorus ions are implanted into a second surface portion of the uppermost n⁻-type layer at the dose amount of $1 \times 10^{13}$ cm⁻² of phosphorus atoms 4.

Referring now to FIG. 3(f), resist masks 52D are removed. A highly resistive n⁻-type layer of 8 μm in thickness is deposited epitaxially on the uppermost n⁻-type epitaxial layer.

Referring now to FIG. 3(g), a first alternating conductivity type layer and a second alternating conductivity type layer on the first alternating conductivity type layer are formed by thermally treating the laminate including the n⁻-type epitaxial layers formed so far at 1150° C. for 20 hours to drive all the implanted impurity atoms. The first alternating conductivity type layer is formed of an n-type drift region 8a and p-type partition regions 8b spaced apart from each other by n-type drift region 8a. The second alternating conductivity type layer is formed of an n-type drift region 18a and p-type partition regions 18b spaced apart from each other by n-type drift region 18a. As exemplary shown in FIGS. 3(f) and 3(g), the four corners of the square lower end face of p-type partition region 18b are located at the centers of the square upper end faces of the nearest four p-type partition regions 8b. in short, four p-type partition regions 8b are connected to p-type partition region 18b.

Then, a surface MOSFET structure is formed in the same way as according to the first embodiment through the conventional steps of forming the MOSFET structure.

Fourth Embodiment

FIGS. 4(a) through 4(f) are top plan views for explaining the steps for manufacturing a super-junction semiconductor device according to a fourth embodiment of the invention. FIG. 4(g) is a vertical cross section along B–B' of FIG. 4(f).

The super-junction semiconductor device according to the fourth embodiment includes a first alternating conductivity type layer on a layer with low electrical resistance and a second alternating conductivity type layer on the first alternating conductivity type layer. The first alternating conductivity type layer includes columnar regions of the second conductivity type and a region of the first conductivity type filling the space between the columnar regions of the second conductivity type. And, the second alternating conductivity type layer includes regions of the first conductivity type and regions of the second conductivity type extending in parallel to each other and alternately arranged with each other. The spacing between the pn-junctions in the second alternating conductivity type layer is wider than the spacing between the pn-junctions in the first alternating conductivity type layer.

Referring now to FIG. 4(a), a highly resistive n⁻-type layer is deposited epitaxially on an n-type substrate with low electrical resistance. The n⁻-type epitaxial layer is 4 μm in thickness.

A resist mask 53A is formed on the n⁻-type epitaxial layer by photolithography. Boron ions as p-type impurity ions are implanted into first surface portions of the n⁻-type epitaxial layer at the dose amount of $1.2 \times 10^{14}$ cm⁻² of boron atoms 7. Resist mask 53A includes square windows, through which boron ions are implanted. The square windows are 4 μm×4 μm in area and spaced apart for 4 μm from each other. In other words, the square windows of 4 μm×4 μm in area are aligned at the pitch of 8 μm.

Referring now to FIG. 4(b), resist mask 53A is removed. Then, resist masks 53B are formed by photolithography on the portions of the n⁻-type epitaxial layer, thereon the square windows of resist mask 53A were positioned. Phosphorus ions are implanted as n-type impurity ions into second surface portions of the n⁻-type epitaxial layer at the dose amount of $4\times10^{13}$ cm⁻² of phosphorus atoms 4.

Referring now to FIG. 4(c), the steps described above with reference to FIGS. 4(a) and 4(b) are repeated as many times as necessary.

Referring now to FIG. 4(d), resist masks 53B are removed. A highly resistive n⁻-type layer of 6 μm in thickness is deposited epitaxially on the uppermost n⁻-type epitaxial layer. Then, resist masks 53C are formed on the uppermost n⁻-type epitaxial layer by photolithography. Boron ions are implanted through resist masks 53C into first surface portions of the uppermost n⁻-type epitaxial layer at the dose amount of $2\times10^{13}$ cm⁻² of boron atoms 7. Resist masks 53C are stripes 8 μm in width, extending in parallel to each other and spaced apart for 8 μm. As described later, resist masks 53C are positioned such that the stripe-shaped p-type regions in the second alternating conductivity type layer are connected to the columnar p-type regions in the first alternating conductivity type layer.

Referring now to FIG. 4(e), resist masks 53C are removed. Then, resist masks 53D are formed by photolithography on the first portions of the uppermost n⁻-type epitaxial layer, therein the boron ions were implanted. Phosphorus ions are implanted through resist masks 53D into second surface portions of the uppermost n⁻-type layer at the dose amount of $2\times10^{13}$ cm⁻² of phosphorus atoms 4. Resist masks 53D are stripes 8 μm in width, extending in parallel to each other and spaced apart for 8 μm. Resist masks 53D are positioned such that the resulting stripe-shaped n-type regions in the second alternating conductivity type layer are connected to the resulting n-type region in the first alternating conductivity type layer.

Referring now to FIG. 4(f), resist masks 53D are removed. A highly resistive n⁻-type layer of 8 μm in thickness is deposited epitaxially on the uppermost n⁻-type epitaxial layer.

Referring now to FIG. 4(g), a first alternating conductivity type layer and a second alternating conductivity type layer on the first alternating conductivity type layer are formed by thermally treating the laminate including the n⁻-type layers so far at 1150° C. for 20 hours to drive all the implanted impurity atoms. The first alternating conductivity type layer is formed of an n-type drift region 8a and p-type partition regions 8b spaced apart from each other by n-type drift region 8a. The second alternating conductivity type layer is formed of n-type drift regions 18a and p-type partition regions 18b extending in parallel to each other and arranged alternately with each other. As exemplary shown in FIGS. 4(f) and 4(g), p-type partition region 18b is connected to two arrays of p-type partition regions 8b.

Then, a surface MOSFET structure is formed in the same way as according to the first embodiment through the conventional steps of forming the MOSFET structure.

Fifth Embodiment

FIGS. 5(a) through 5(f) are cross sectional views for explaining the steps for manufacturing a super-junction semiconductor device according to a fifth embodiment of the invention. FIG. 6 is a cross sectional view of the super-junction semiconductor device according to the fifth embodiment of the invention. The super-junction semiconductor device according to the fifth embodiment includes a first alternating conductivity type layer and a second alternating conductivity type layer between a layer with low electrical resistance and a first major surface of a semiconductor chip. As shown in FIG. 6, the spacing between the pn-junctions in the second alternating conductivity type layer is wider than the spacing between the pn-junctions in the first alternating conductivity type layer. In FIG. 6, the regions of a first conductivity type and the regions of a second conductivity type in the first alternating conductivity type layer are extended in parallel to the regions of the first conductivity type and the regions of the second conductivity type in the second alternating conductivity type layer. Alternatively, the regions of the first conductivity type and the regions of the second conductivity type in the first alternating conductivity type layer may be extended in perpendicular to the regions of the first conductivity type and the regions of the second conductivity type in the second alternating conductivity type layer.

Now the steps for manufacturing the super-junction semiconductor device according to the fifth embodiment will be explained with reference to FIGS. 5(a) through 5(f).

Figure 5A:
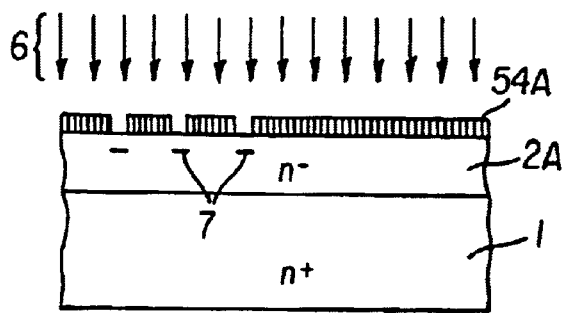
Figure 5D:
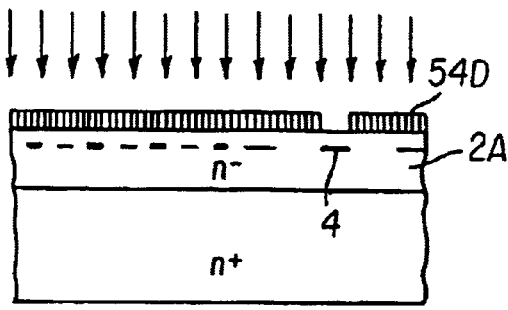

Referring at first to FIG. 5(a), a highly resistive n⁻-type layer 2A is deposited epitaxially on an n-type substrate 1 with low electrical resistance. The n⁻-type layer 2A is 4 μm in thickness.

A resist mask 54A is formed on the n⁻-type epitaxial layer. First windows are opened in a predetermined portion of resist mask 54A by photolithography. Boron ions 6 as p-type impurity ions are implanted through the first windows into first surface portions of n⁻-type layer 2A at the dose amount of $2\times10^{13}$ cm⁻² of boron atoms 7. The first windows are 2 μm in width and spaced apart for 6 μm from each other. In other words, the first windows are arranged at the pitch of 8 μm.

Figure 5B:
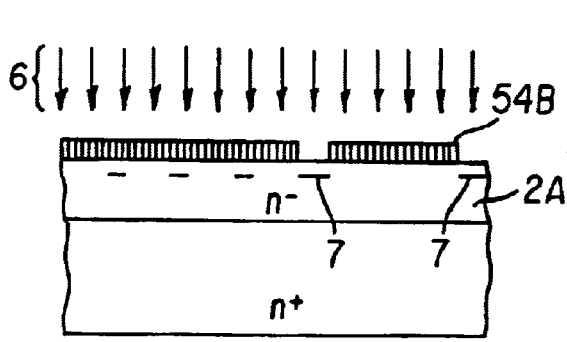

Referring now to FIG. 5(b), resist mask 54A is removed. Then, a resist mask 54B is formed by photolithography on n⁻-type layer 2A. Second windows are opened in a predetermined portion of resist mask 54B above a second surface portion of n⁻-type layer 2A. Boron ions 6 as p-type impurity ions are implanted through the second windows into the second surface portion of n⁻-type layer 2A at the dose amount of $1\times10^{13}$ cm⁻² of phosphorus atoms 4. The second windows are 4 μm in width and spaced apart for 12 μm from each other. In other words, the second windows are arranged at the pitch of 16 μm.

Figure 5E:
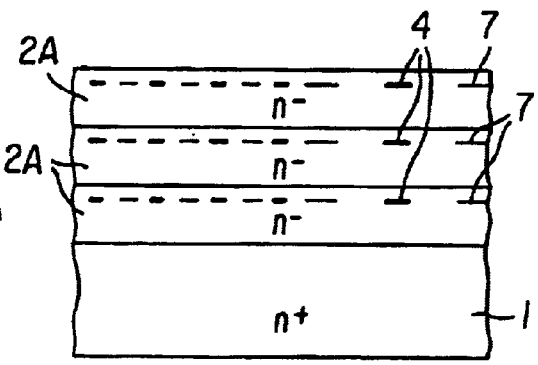
Figure 5C:
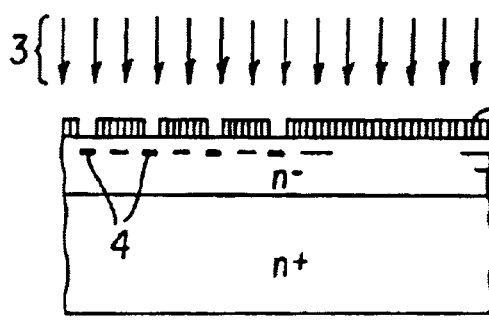

Referring now to FIG. 5(c), resist mask 54B is removed. Then, a resist mask 54C is formed by photolithography on n⁻-type epitaxial layer 2A. Third windows are opened by photolithography in the portion of resist mask 54C above the first surface portion of n⁻-type layer 2A. The third windows are positioned at the midpoints between the locations of the first windows of resist mask 54A. Phosphorus ions 3 are implanted as n-type impurity ions into the first surface portions of n⁻-type layer 2A at the dose amount of $2\times10^{13}$ cm⁻² of phosphorus atoms 4. The third windows are 2 μm in width and arranged at the pitch of 8 μm Referring now to FIG. 5(d), resist mask 54C is removed. Then, a resist mask 54D is formed by photolithography on n⁻-type layer 2A. Fourth windows are opened by photolithography in the portion of resist mask 54D above the second surface portion of n⁻-type layer 2A. The fourth windows are positioned at the midpoints between the locations of the second windows of resist mask 54B. Phosphorus ions 3 are implanted through the fourth windows into the second surface portions of n⁻-type layer 2A at the dose amount of $1\times10^{13}$ cm⁻² of phosphorus atoms 4. The third windows are 4 μm in width and arranged at the pitch of 16 μm.

Referring now to FIG. 5(e), the steps of epitaxial growth, boron ion implantation and phosphorus ion implantation described above with reference to FIGS. 5(a) through 5(d) are repeated as many times as necessary.

Figure 5F:
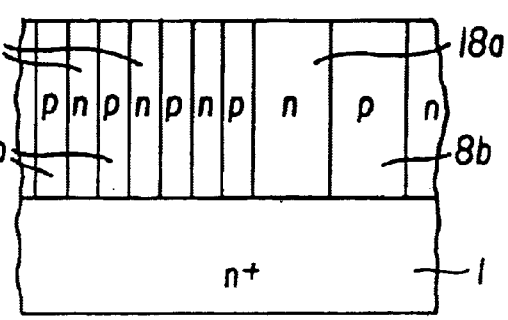

Referring now to FIG. 5(f), resist mask 54D is removed. A highly resistive n⁻-type layer 21A of 4 μm in thickness is deposited epitaxially on the uppermost n⁻-type layer 2A.

A first alternating conductivity type layer and a second alternating conductivity type layer on the first alternating conductivity type layer are formed by thermally treating the laminate including n⁻-type layers 21A formed so far at 1150° C. for 20 hours to drive all the implanted impurity atoms. The first alternating conductivity type layer is formed of n-type drift regions 8a and p-type partition regions 8b arranged alternately with each other. The second alternating conductivity type layer is formed of n-type drift regions 18a and p-type partition regions 18b arranged alternately with each other. The pn-junctions between n-type drift regions 18a and p-type partition regions 18b are spaced apart more widely from each other than the pn-junctions between n-type drift regions 8a and p-type partition regions 8b.

Finally, a surface MOSFET structure is formed in the same way as according to the first embodiment through the conventional steps of forming the MOSFET structure.

Although the invention has been explained in connection with n-channel super-junction MOSFET's and the manufacturing methods thereof, it is obvious to those skilled in the art that the invention is applicable also to the p-channel super-junction MOSFET's by interchanging the conductivity types of the constituent layers and regions according to the foregoing embodiments. Although the invention has been explained in connection with the super-junction MOSFET's including one second alternating conductivity layer, the super-junction semiconductor devices may include a plurality of second alternating conductivity layer formed of regions of the first conductivity type and regions of the second conductivity type. The spacing between the pn-junctions in the second alternating conductivity layer is wider than the spacing between the pn-junctions in the first alternating conductivity layer. Boron ions and phosphorous ions are implanted at the respective dose amounts, which facilitate depleting n-type drift regions 8a and 18a and p-type partition regions 8b and 18b.

The super-junction semiconductor device according to the invention, that widens the spacing between the pn-junctions in the alternating conductivity type layer on the side of the first major surface of the semiconductor chip, facilitates narrowing the spacing between the pn-junctions in the alternating conductivity type layer inside the semiconductor chip without increasing the manufacturing costs. Therefore, the super-junction semiconductor device according to the invention facilitates reducing the on-resistance while keeping a high breakdown voltage. The manufacturing method according to the invention facilitates manufacturing super-junction semiconductor devices with low costs and with excellent mass-productivity.

The invention has been described with reference to certain preferred embodiments thereof. It will be understood, however, that the invention is not limited to the specifically described embodiments and modifications and variations thereof are possible within the scope of the appended claims.

What is claimed is:

1. A semiconductor device comprising:
   a semiconductor chip having a first major surface and a second major surface facing opposite to the first major surface;
   a layer of a first conductivity type with low electrical resistance on the side of the second major surface;
   a first alternating conductivity type layer above the layer with low electrical resistance, the first alternating conductivity type layer comprising one or more first regions of a first conductivity type and second regions of a second conductivity type, the first regions and the second regions forming first pn-junctions therebetween; and
   a second alternating conductivity type layer in plane contact with the first alternating conductivity type layer, the second alternating conductivity type layer comprising one or more third regions of the first conductivity type and fourth regions of the second conductivity type, the third regions and the fourth regions forming second pn-junctions therebetween;
   a plurality of well regions of the second conductivity type formed in the second alternating conductivity type lave, on the side of the first major surface, and
   source regions of the first conductivity type formed in the well regions, on the side of the first major surface,
   wherein the second pn-junctions in the second alternating conductivity type layer is spaced apart from each other by a wider spacing than the first pn-junctions in the first alternating conductivity type layer; and
   wherein the boundary between the first alternating conductivity type layer and the second alternating conductivity type layer extends substantially parallel to the first major surface.

2. The semiconductor device according to claim 1, wherein surfaces of the first pn-junctions in the first alternating conductivity type layer are substantially parallel to surfaces of the second pn-junctions in the second alternating conductivity type layer.

3. The semiconductor device according to claim 1, wherein the first regions of the first conductivity type in the first alternating conductivity type layer are connected to the third regions of the first conductivity type in the second alternating conductivity type layer, and the second regions of the second conductivity type in the first alternating conductivity type layer are connected to the fourth regions of the second conductivity type in the second alternating conductivity type layer.

4. The semiconductor device according to claim 1, wherein the third regions and the fourth regions in second alternating conductivity type layer are arranged differently from the first regions and the second regions in first alternating conductivity type layer.

5. The semiconductor device according to claim 1, wherein the width of each of said first, second, third, and fourth regions is substantially parallel along an entire height thereof, and the width of each of said well regions narrows from the first major surface toward the second major surface.

6. A semiconductor device comprising:
   a semiconductor chip having a first major surface and a second major surface facing opposite to the first major surface;
   a layer of a first conductivity type with low electrical resistance on the side of the second major surface;
   a first alternating conductivity type layer above the layer with low electrical resistance, the first alternating conductivity type layer comprising one or more first regions of the first conductivity type and second regions of a second conductivity type, the first regions and the second regions forming first pn-junctions therebetween; and
   a second alternating conductivity type layer in plane contact with the first alternating conductivity type layer, the second alternating conductivity type layer comprising one or more third regions of the first conductivity type and fourth regions of the second conductivity type, the third regions and the fourth regions forming second pn-junctions therebetween, wherein the second pn-junctions in the second alternating conductivity type layer is spaced apart from each other by a wider spacing than the first pn-junctions in the first alternating conductivity type layer, wherein the second alternating conductivity type layer is between the first alternating conductivity type layer and the first major surface, and wherein a plurality of well regions of the second conductivity type are formed in the second alternating conductivity type layer, and source regions of the first conductivity type are formed in the well regions.

7. The semiconductor device according to claim 6, wherein the width of each of said first, second, third, and fourth regions is substantially parallel along an entire height thereof, and the width of each of said well regions narrows from the first major surface toward the second major surface.

8. A semiconductor device comprising:

a semiconductor chip having a first major surface and a second major surface facing opposite to the first major surface;

a layer of a first conductivity type with low electrical resistance on the side of the second major surface;

a first alternating conductivity type layer above the layer with low electrical resistance, the first alternating conductivity type layer comprising one or more first regions of the first conductivity type and second regions of a second conductivity type, the first regions and the second regions forming first pn-junctions therebetween; and a second alternating conductivity type layer in plane contact with the first alternating conductivity type layer, the second alternating conductivity type layer comprising one or more third regions of the first conductivity type and fourth regions of the second conductivity type, the third regions and the fourth regions forming second pn-junctions therebetween, wherein the second pn-junctions in the second alternating conductivity type layer is spaced apart from each other by a wider spacing than the first pn-junctions in the first alternating conductivity type layer, wherein surfaces of the first pn-junctions in the first alternating conductivity type layer are substantially perpendicular to surfaces of the second pn-junctions in the second alternating conductivity type layer, and wherein a plurality of well regions of the second conductivity type are formed in the second alternating conductivity type layer, and source regions of the first conductivity type are formed in the well regions.

9. The semiconductor device according to claim 8, wherein the width of each of said first, second, third, and fourth regions is substantially parallel along an entire height thereof, and the width of each of said well regions narrows from the first major surface toward the second major surface.

* * * * *